United States Patent
Kim

(10) Patent No.: US 8,144,267 B2
(45) Date of Patent: Mar. 27, 2012

(54) DISPLAY APPARATUS

(75) Inventor: Jin Hyuk Kim, Gumi-si (KR)

(73) Assignee: LG Electronics Inc., Seoul (KR)

( * ) Notice: Subject to any disclaimer, the term of this patent is extended or adjusted under 35 U.S.C. 154(b) by 1035 days.

(21) Appl. No.: 12/031,233

(22) Filed: Feb. 14, 2008

(65) Prior Publication Data

US 2009/0141198 A1 Jun. 4, 2009

(30) Foreign Application Priority Data

Dec. 3, 2007 (KR) .................. 10-2007-0124130

(51) Int. Cl.
H04N 5/64 (2006.01)
(52) U.S. Cl. .............................. 348/836; 348/843
(58) Field of Classification Search .................. 348/836, 348/837, 838, 839, 840, 841, 842, 843; 248/917; 361/679.21, 679.01
See application file for complete search history.

(56) References Cited

U.S. PATENT DOCUMENTS

| | | | |
|---|---|---|---|
| 5,146,354 A | 9/1992 | Plesinger | |
| 5,164,542 A | 11/1992 | Hart | 174/35 |
| 5,335,100 A | 8/1994 | Obata | |
| 5,422,751 A | 6/1995 | Lewis et al. | |
| 5,524,908 A | 6/1996 | Reis | |
| 5,579,595 A | 12/1996 | Dutton | |
| 5,841,227 A | 11/1998 | Terpin | |
| 6,008,870 A | 12/1999 | Yun | |
| 6,144,552 A | 11/2000 | Whitcher et al. | |
| 6,181,390 B1 | 1/2001 | Wang et al. | |
| 6,330,045 B1 | 12/2001 | Tanaka | |
| 6,381,124 B1 | 4/2002 | Whitcher et al. | |
| 6,462,939 B1 | 10/2002 | Heirich | |
| 6,477,039 B2 | 11/2002 | Tajima | 361/679.21 |
| 6,522,371 B1 | 2/2003 | Sakamoto et al. | 349/58 |
| 6,532,152 B1 | 3/2003 | White et al. | 361/692 |
| 6,560,124 B1 | 5/2003 | Irie et al. | 361/679.21 |
| 6,578,972 B1 | 6/2003 | Heirich et al. | |
| 6,707,478 B2 | 3/2004 | Kim | 345/156 |
| 6,801,195 B2 | 10/2004 | Yoshida | |
| 6,802,717 B2 | 10/2004 | Catro | 434/169 |
| 6,809,713 B2 | 10/2004 | Peng | 345/87 |
| 6,813,159 B2 | 11/2004 | Irie et al. | 361/679.24 |
| 6,819,550 B2 | 11/2004 | Jobs et al. | 361/683 |
| 6,848,793 B2 * | 2/2005 | Utsumi | 353/74 |
| 6,891,582 B2 | 5/2005 | Hwang | |
| 6,930,734 B2 | 8/2005 | Lee | 361/679.21 |
| 6,937,297 B2 | 8/2005 | Kang et al. | |

(Continued)

FOREIGN PATENT DOCUMENTS

CN 1579091 2/2005

(Continued)

OTHER PUBLICATIONS

U.S. Office Action U.S. Appl. No. 12/031,203 dated Jan. 19, 2010.

(Continued)

Primary Examiner — Branon Painter
(74) Attorney, Agent, or Firm — KED & Associates, LLP

(57) ABSTRACT

A display apparatus is provided. The display apparatus does not require a cover structure for enclosing a front peripheral portion of a front panel so that the screen of the display apparatus can be seemed to be large, and the display apparatus can have a neat appearance.

25 Claims, 4 Drawing Sheets

U.S. PATENT DOCUMENTS

| | | | |
|---|---|---|---|
| D532,011 S | 11/2006 | Andre et al. | D14/375 |
| 7,206,038 B2 | 4/2007 | Choi et al. | 349/58 |
| 7,251,140 B2 | 7/2007 | Bae et al. | 361/719 |
| 7,304,250 B2 | 12/2007 | Arakawa et al. | 174/381 |
| 7,319,499 B2 | 1/2008 | Peng | 361/679.27 |
| 7,327,407 B2 | 2/2008 | Huber | 348/789 |
| 7,348,964 B1 | 3/2008 | Gettemy et al. | 345/173 |
| 7,423,878 B2 | 9/2008 | Kim | |
| 7,433,178 B2 | 10/2008 | Bang et al. | 361/679.27 |
| 7,450,112 B2 | 11/2008 | Shneidman | 345/173 |
| 7,466,540 B2 | 12/2008 | Takahashi et al. | 361/679.27 |
| 7,495,894 B2 | 2/2009 | Yu et al. | 361/681 |
| 7,508,654 B2 | 3/2009 | Lee et al. | |
| 7,561,422 B2 | 7/2009 | Meng et al. | 361/681 |
| 7,626,808 B2 | 12/2009 | Tai et al. | |
| 7,626,809 B2 | 12/2009 | Tai et al. | 361/679.21 |
| 7,663,870 B2 | 2/2010 | Choi | |
| 7,697,272 B2 | 4/2010 | Choi | |
| 7,760,491 B2 | 7/2010 | Choi | |
| 7,764,332 B2 | 7/2010 | Zhang | |
| 7,889,484 B2 | 2/2011 | Choi | |
| 7,929,280 B2 | 4/2011 | Choi | |
| 7,929,287 B2 | 4/2011 | Yukawa et al. | |
| 2002/0067591 A1 | 6/2002 | Tajima | 361/681 |
| 2003/0184958 A1 | 10/2003 | Kao | |
| 2004/0027498 A1* | 2/2004 | Huber | 348/787 |
| 2004/0156168 A1 | 8/2004 | LeVasseur et al. | 361/681 |
| 2004/0239619 A1 | 12/2004 | Takahashi et al. | |
| 2005/0083646 A1* | 4/2005 | Bae et al. | 361/686 |
| 2005/0093429 A1 | 5/2005 | Ahn et al. | 313/498 |
| 2005/0117283 A1 | 6/2005 | Lee et al. | |
| 2005/0174726 A1 | 8/2005 | Bang et al. | 361/681 |
| 2005/0212982 A1 | 9/2005 | Soga | 348/825 |
| 2005/0270734 A1 | 12/2005 | Lam et al. | |
| 2006/0012962 A1 | 1/2006 | Obata | |
| 2006/0040520 A1 | 2/2006 | Moh | |
| 2006/0043854 A1 | 3/2006 | Kim | |
| 2006/0044746 A1 | 3/2006 | Kim et al. | |
| 2006/0077620 A1 | 4/2006 | Kim | 361/681 |
| 2006/0077629 A1* | 4/2006 | Shiraishi | 361/681 |
| 2006/0133017 A1 | 6/2006 | Bang | |
| 2006/0192753 A1 | 8/2006 | Fukuhara | |
| 2006/0209502 A1 | 9/2006 | Sakata et al. | |
| 2006/0237599 A1 | 10/2006 | Ternus et al. | 248/176.1 |
| 2007/0040891 A1 | 2/2007 | Calloway | |
| 2007/0076138 A1 | 4/2007 | Chiu et al. | |
| 2007/0200963 A1* | 8/2007 | Shin | 348/836 |
| 2007/0211191 A1 | 9/2007 | Cho et al. | 349/58 |
| 2008/0165480 A1* | 7/2008 | Tai et al. | 361/681 |
| 2008/0186662 A1 | 8/2008 | Lee | |
| 2008/0218952 A1* | 9/2008 | Benn | 361/681 |
| 2008/0297999 A1 | 12/2008 | Choi | 361/681 |
| 2008/0298000 A1 | 12/2008 | Choi | 361/681 |
| 2008/0298001 A1 | 12/2008 | Choi | 361/681 |
| 2009/0086123 A1* | 4/2009 | Tsuji et al. | 349/58 |
| 2009/0225507 A1 | 9/2009 | Sato | |
| 2009/0279240 A1 | 11/2009 | Karppanen | |
| 2010/0046193 A1 | 2/2010 | Choi | |
| 2010/0118479 A1 | 5/2010 | Choi | |
| 2011/0037719 A1 | 2/2011 | Choi | |

FOREIGN PATENT DOCUMENTS

| | | |
|---|---|---|
| JP | 2001-125072 | 5/2001 |
| JP | 2004-059822 | 3/2004 |
| JP | 2004-302117 | 10/2004 |
| JP | 2004-361664 | 12/2004 |
| JP | 2005-070662 | 3/2005 |
| JP | 2005-079865 | 3/2005 |
| JP | 2006-010967 | 1/2006 |
| JP | 2006-235425 | 9/2006 |
| JP | 2007-017513 | 1/2007 |
| JP | 2007-114807 | 5/2007 |
| KR | 2005-0029780 | 3/2005 |
| KR | 10-2005-0034186 | 4/2005 |
| KR | 1020050034186 | 4/2005 |
| KR | 1020060008751 | 1/2006 |
| KR | 10-2006-0017232 | 2/2006 |
| KR | 2006-0017232 | 2/2006 |
| KR | 1020060021076 | 3/2006 |
| KR | 10-2006-0059536 | 6/2006 |
| KR | 10-2006-0098882 | 9/2006 |
| KR | 2006-0098882 | 9/2006 |
| WO | WO 2005/112439 | 11/2005 |
| WO | WO 2010/047450 | 4/2010 |

OTHER PUBLICATIONS

U.S. Office Action U.S. Appl. No. 12/609,279 dated Mar. 30, 2010.
European Search Report dated Jun. 8, 2010 for Application 07851534.3.
European Search Report dated Jun. 11, 2010 for Application 07851532.7.
Notice of Allowance dated Jul. 20, 2010 for U.S. Appl. No. 12/031,203.
Office Action dated Sep. 13, 2010 from co-pending U.S. Appl. No. 12/692,386.
LG KG800 "Chocolate" GSM/GPRS 900/1800/1900Mhz Cellular Phone, Report #11816-060725-BTf, pp. 1-137; Portelligent, www.teardown.com, 2006.
Apple iMac computer: 1998 Original iMac 15", 2002 iMac 20", 2005 iMac 20" and 2007 iMac 20". Inside look of the Apple iMac at link: http://www.ifixit.com/Teardown/iMac-20-Inch/658/1.
Notice of Allowance dated Sep. 25, 2009.
Office Action dated Dec. 17, 2009 for U.S. Appl. No. 12/031,129.
U.S. Office Action U.S. Appl. No. 12/609,279 dated Sep. 2, 2010.
Korean Office Action dated Jan. 5, 2011.
Chinese Office Action dated Feb. 1, 2011.
U.S. Office Action dated Jun. 23, 2011 for U.S. Appl. No. 12/609,279.
U.S. Office Action dated Jun. 13, 2011 for U.S. Appl. No. 12/692,386.
U.S. Office Action dated May 13, 2011 for U.S. Appl. No. 12/954,289.
International Search Report dated Aug. 27, 2008.
Notification of Transmittal of the International Search Report and the Written Opinion of the International Searching Authority, or the Declaration dated Aug. 27, 2008.
Written Opinion of the International Searching Authority dated Aug. 27, 2008.
Office Action dated Nov. 23, 2011 for U.S. Appl. No. 12/692,386.

* cited by examiner

DISPLAY APPARATUS

CROSS-REFERENCE TO RELATED APPLICATIONS

The present application claims priority under 35 U.S.C. 119 and 35 U.S.C. 365 to Korean Patent Application No. 10-2007-0124130 filed on Dec. 3, 2007, which is hereby incorporated by reference in its entirety.

BACKGROUND

The present disclosure relates to a display apparatus.

Recently, high quality and large display apparatuses such as a liquid crystal display (LCD) and a plasma display panel (PDP) have been developed.

Such a display apparatus includes a front cover for enclosing a front peripheral portion.

In detail, the display apparatus includes a transparent front panel disposed at a front side of a display module. The front panel protects the display module and transmits images output from the display module. The periphery of the front panel is fixed to the front cover. In other words, the front cover supports the front panel.

However, since the front cover supports the periphery of the front panel, a peripheral portion of the front panel is hidden by the front cover.

Therefore, the screen size of the display apparatus is reduced due to the hidden portion of the front panel.

Moreover, since the front cover is additionally required to support the front panel, the manufacturing costs and processes of the display apparatus increase.

For this reason, instead of using the front cover, a support member can be used to support the front panel and the display module. However, in this case, an adhesive applied between the front panel and the support member can easily spread or leak, and thus the width of the support member increases.

SUMMARY

Embodiments provide a display apparatus in which the periphery of a front panel is exposed to the outside of the display apparatus so that the screen of the display apparatus can be seemed to be large.

Embodiments also provide a display apparatus in which a front panel can be stably supported for protecting a display module although a front peripheral portion of the front panel is exposed to the outside of the display apparatus.

Embodiments also provide a display apparatus in which a slim support is attached to a rear side of a front panel for supporting a display module, and an adhesive applied between the front panel and the slim support does not spread or leak.

In one embodiment, a display apparatus includes: a transparent front panel including an exposed peripheral portion; a display module outputting an image at a rear side of the front panel; at least one support attached to the rear side of the front panel for supporting weight of the front panel; a frame disposed along a rear edge portion of the front panel; and a back cover covering the display module from the rear side of the front panel.

In another embodiment, a display apparatus includes: a front panel including an entirely exposed front edge portion; a display module spaced a predetermined distance apart from a rear side of the front panel and configured to output an image; a plurality of supports attached to the rear side of the front panel and configured to support weight of the front panel; a frame fixed to the supports from the rear side of the front panel; and a back cover fixed to the frame and enclosing the display module for protecting the display module, wherein at least left, right, and upper sides of the frame are respectively placed on the same planes as left, right, and upper sides of the front panel, or are respectively placed on the planes which are placed apart from the left, right, and upper sides of the front panel towards the center of the front panel.

In a further embodiment, a display apparatus includes: a front panel including an opaque shield film, the opaque shield film having a predetermined width and being disposed along an edge portion of the front panel; at least one support attached to a rear side of the front panel at which the shield film is disposed, the support being attached to the rear side of the front panel using an adhesive; a display module supported by the support and outputting an image; a back cover fixed to the support from the rear side of the front panel; and a ground panel including one end tightly disposed on the back cover and the other end disposed on the rear side of the front panel, wherein the support includes a leakage preventing rib on a front edge close to an outer edge of the front panel for preventing leakage of the adhesive.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. The present disclosure may, however, be embodied in many different forms and should not be construed as being limited to the embodiments set forth herein.

Figure 1:
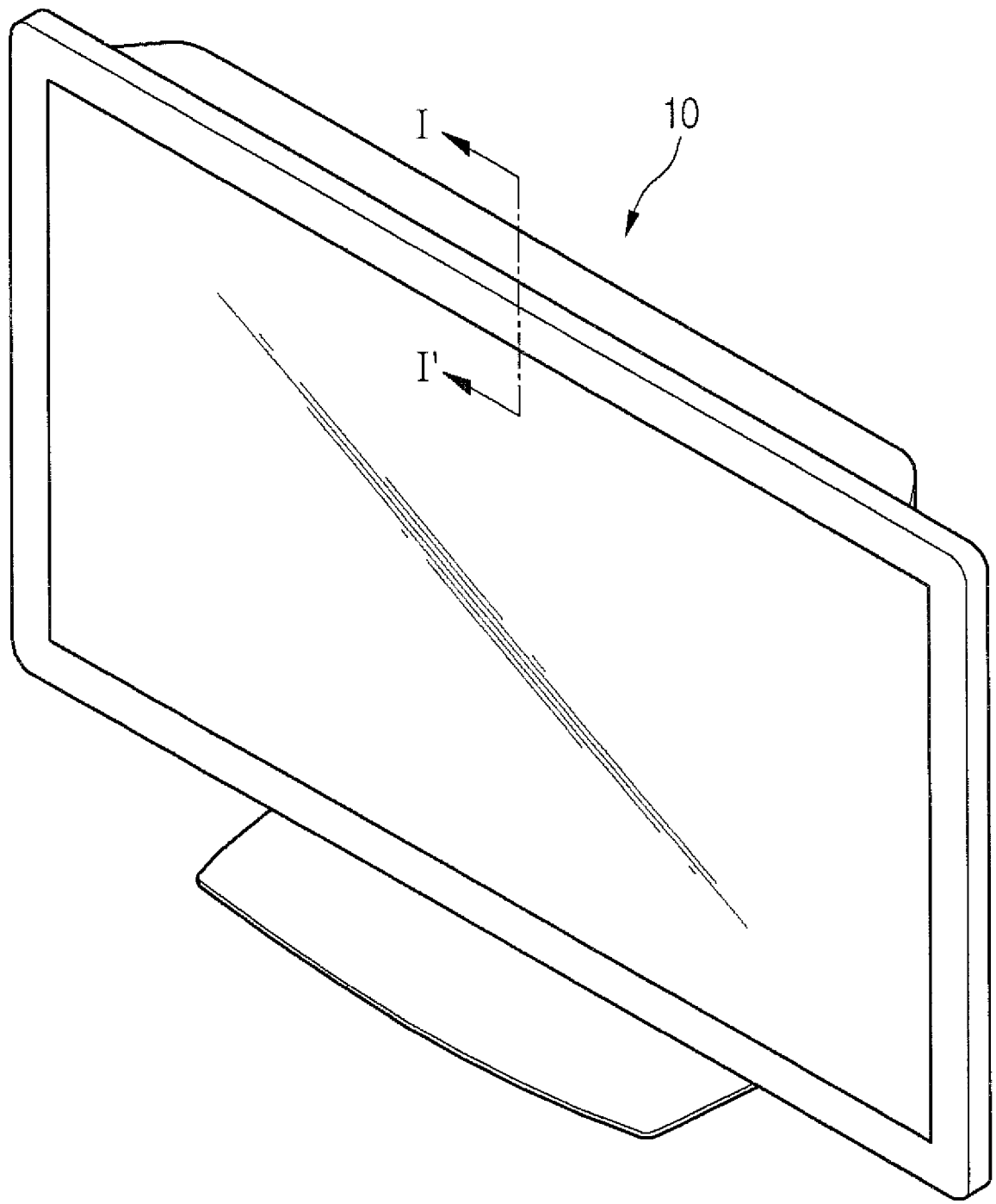
FIG. 1 is a perspective view illustrating a display apparatus according to an embodiment.
Figure 2:
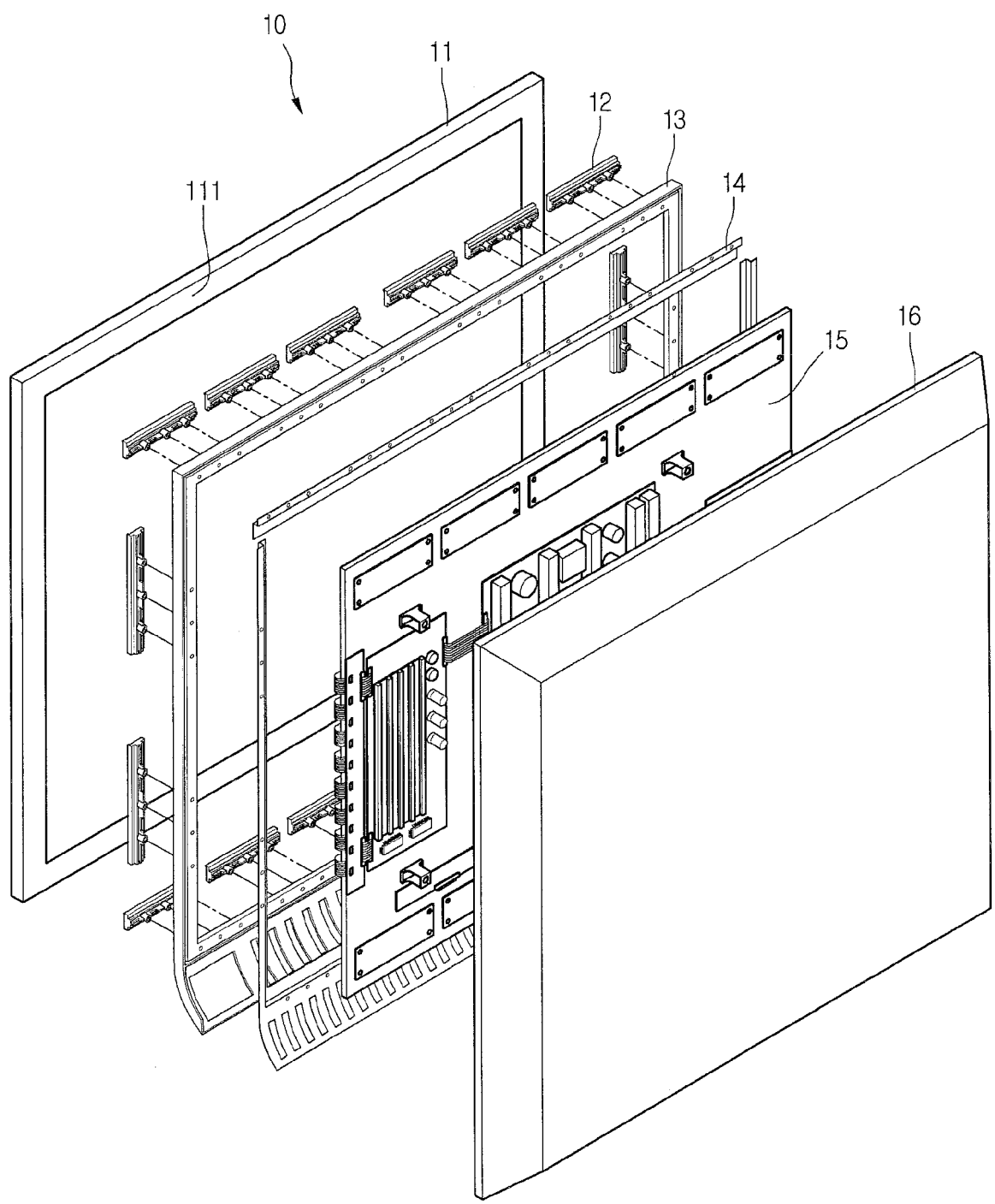
FIG. 2 is an exploded perspective view illustrating the display apparatus according to an embodiment.

FIG. 1 is a perspective view illustrating a display apparatus 10 according to an embodiment, and FIG. 2 is an exploded perspective view illustrating the display apparatus 10 according to an embodiment.

Referring to FIGS. 1 and 2, the display apparatus 10 of the current embodiment includes a display module 15, a front panel 11, a plurality of supports 12, a frame 13, a back cover 16, and a ground panel 14. The display module 15 outputs image signals, and the front panel 11 protects a front side of the display module 15. The supports 12 are arranged at predetermined intervals along rear edges of the front panel 11. The frame 13 extends along the rear edges of the front panel 11 and is coupled to the supports 12. The back cover 16 is coupled to a rear side of the front panel 11 to protect the display module 15 and other components. One side of the ground panel 14 is coupled to the rear side of the front panel 11, and the other side of the ground panel 14 is coupled to the back cover 16.

In detail, the front panel 11 has a predetermined thickness and is formed of glass. The front panel 11 transmits images output from the display module 15. When assembled, edges of the back cover 16 are disposed inside the frame 13 so that the edges of the back cover 16 are not exposed to the outside of the display apparatus 10. That is, left, right, upper, and lower sides of the display apparatus 10 can be neat owing to the frame 13.

Edge portions of the display module 15 are fixed to a rear side of the frame 13, and the frame 13 and the back cover 16 are fixed to back sides of the supports 12 using fastening members. In this structure, the weights of the display module 15, the frame 13, and the back cover 16 are applied to the supports 12. The supports 12 are fixed to the rear side of the front panel 11. For this, an adhesive 17 (refer to FIG. 5) is applied between the front panel 11 and the supports 12. The adhesive 17 is sufficiently sticky for maintaining the bonding between the front panel 11 and the supports 12 against the weights of the display module 15, the frame 13, and the back cover 16. The adhesive 17 can be a polyurethane based liquid adhesive. The assembling structure of the components of the display apparatus 10 such as the supports 12, the frame 13, and the back cover 16 will be described later in detail with reference to the accompanying drawings.

An opaque shield film 111 is disposed along edges of the front panel 11. In detail, the shield film 111 can be attached to the front panel 11 in various manners. For example, the shield film 111 can be attached to the front panel 11 by a coating method. In another example, the shield film 111 can be inserted into the front panel 11 when the front panel 11 is fabricated.

Figure 3:
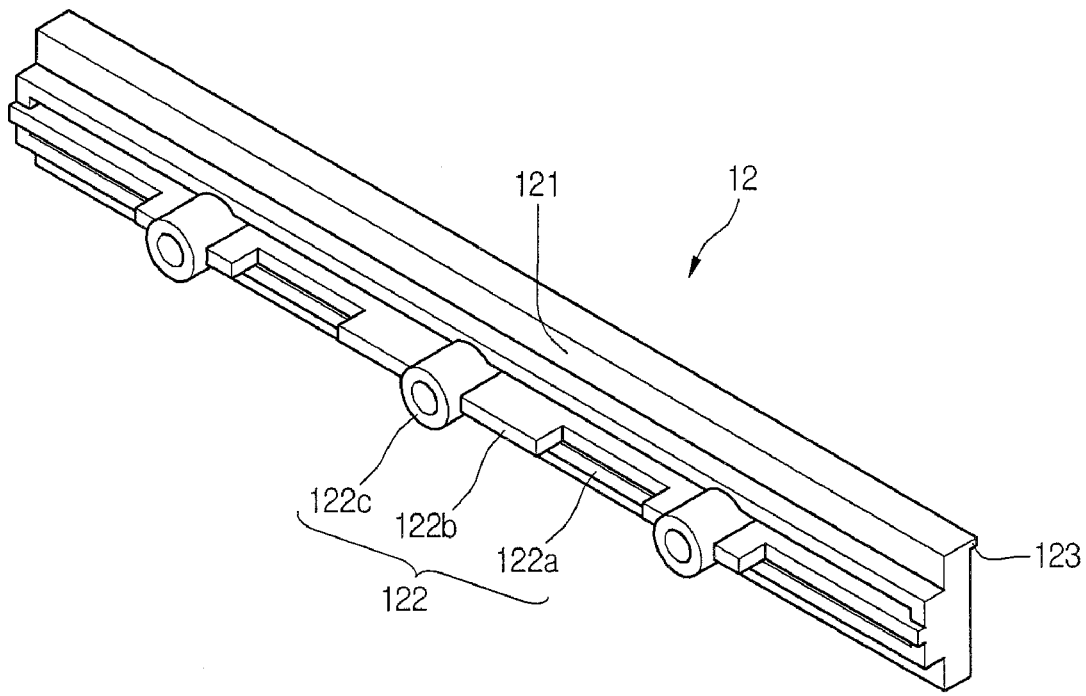
FIG. 3 is a front perspective view illustrating a support of the display apparatus according to an embodiment.
Figure 4:
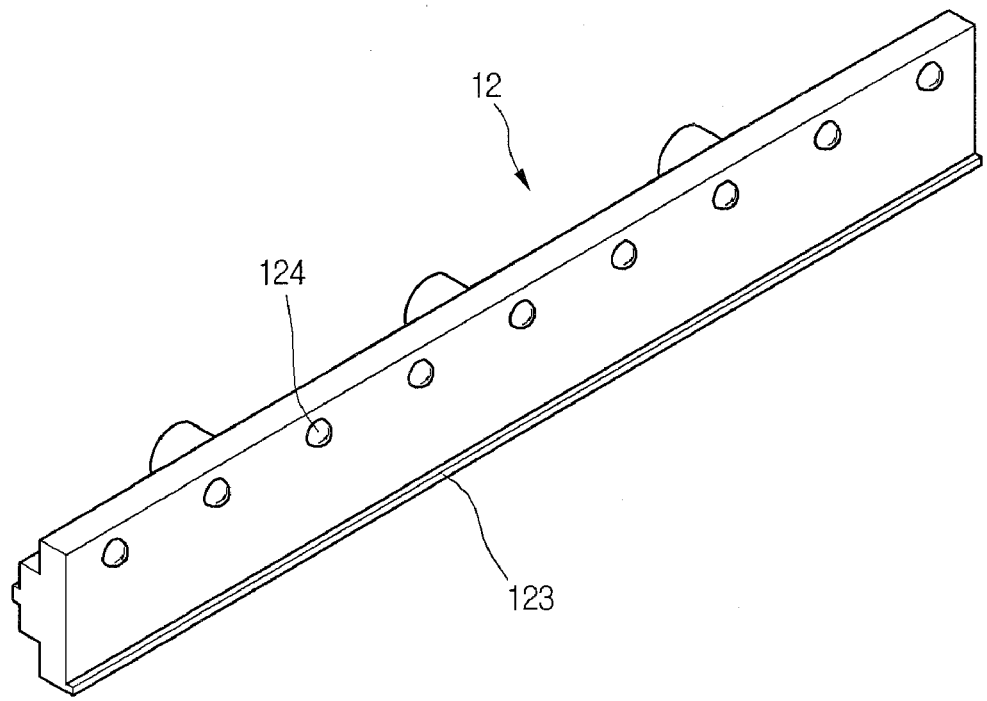
FIG. 4 is a bottom perspective view illustrating the support according to an embodiment.

FIG. 3 is a front perspective view illustrating one of the supports 12 of the display apparatus 10 according to an embodiment, and FIG. 4 is a bottom perspective view illustrating the support 12 according to an embodiment.

Referring to FIGS. 3 and 4, the support 12 of the current embodiment can be formed of a plastic material having a predetermined strength by an injection molding method.

In detail, when the support 12 is injection-molded to a length corresponding to that of the front panel 11, the support 12 can deform due to its long length. For example, the support 12 can bend or swell during the injection molding. Therefore, after a plurality of short supports 12 are prepared by injection molding, the short supports 12 can be attached to the front panel 11 at regular intervals as shown in FIG. 2.

Meanwhile, the support 12 includes a body 121 and a support portion 122. When assembled, the body 121 is tightly attached to the rear side of the front panel 11. The support portion 122 extends backward from the body 121.

In detail, a leakage preventing rib 123 is formed along a front edge of the body 121 to prevent leakage or spreading of a liquid adhesive. When the support 12 is attached to the rear side of the front panel 11, the leakage preventing rib 123 is disposed outwardly. A plurality of protrusions 124 is formed along another front edge of the body 121 opposite to the front edge of the body 121 where the leakage preventing rib 123 is formed. The protrusions 124 are arranged at predetermined intervals. The protrusions 124 may have a height substantially equal to that of the leakage preventing rib 123 to prevent the support 12 from inclining. If the support 12 inclines in the direction of the protrusions 124, the frame 13, the back cover 16, and the display module 15 cannot be stably supported.

Owing to the protrusions 124, an adhesive applied to a front side of the support 12 can be exposed to air. Therefore, the adhesive can be hardened more rapidly, and the thickness of the adhesive can be uniform between the support 12 and the front panel 11. Thus, the bonding strength between the support 12 and the front panel 11 can be uniform.

Meanwhile, the support portion 122 of the support 12 includes a reinforcement part 122a and coupling bosses 122c. The reinforcement part 122a is formed on a center portion of the body 121 of the support 12 in the form of a rib having different heights, and the coupling bosses 122c extend from the reinforcement part 122a to a predetermined length.

In detail, the coupling bosses 122c are arranged at regular intervals from one side to the other side of the support portion 122. Reinforcement ribs 122b are formed on peripheries of the coupling bosses 122c, respectively. Thus, loads can be distributed from the coupling bosses 122c to the reinforcement ribs 122b, and thus the coupling bosses 122c can be protected from loads.

Figure 5:
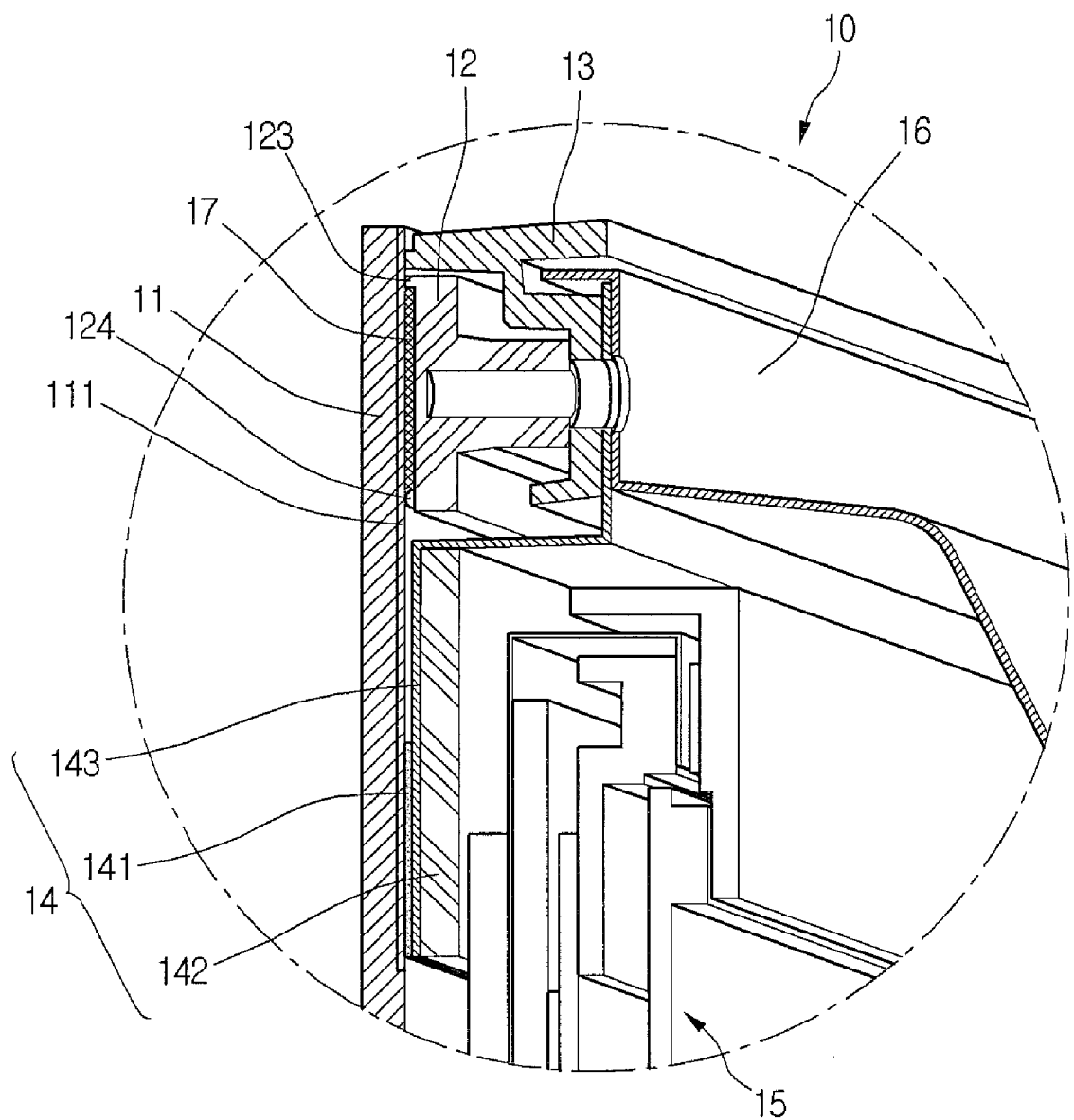
FIG. 5 is a sectional view taken along line I-I' of FIG. 1 according to an embodiment.

FIG. 5 is a sectional view taken along line I-I' of FIG. 1 according to an embodiment.

Referring to FIG. 5, the shield film 111 is attached to edge portions of the front panel 11, and then the support 12 is attached to the front panel 11. That is, the shield film 111 is disposed between the front panel 11 and the support 12. Therefore, the support 12 is not seen from the front of the display apparatus 10.

In detail, a plurality of supports 12 is arranged on rear edge portions of the front panel 11 (refer to FIG. 2). The adhesive 17 is applied to the front side of the support 12. The adhesive 17 does not spread outward from the support 12 owing to the leakage preventing rib 123 formed on the front edge of the support 12. Since the protrusions 124 are disposed on a front edge portion of the support 12 opposite to the leakage preventing rib 123, the support 12 can be attached to the front panel 11 in parallel with the front panel 11. The adhesive 17 forms a uniform adhesive layer between the support 12 and the front panel 11.

The frame 13 covers the rear edge portion of the front panel 11 and the rear side of the support 12. The frame 13 makes stable contact with the rear side of the support 12. Holes (refer to FIG. 2) are formed in a portion of the frame 13 that makes contact with the support 12 for receiving fastening members (one shown in FIG. 5). The ground panel 14 includes a plurality of bent portions. An upper portion of the ground panel 14 is stably disposed on the frame 13, and a lower portion of the ground panel 14 is stably disposed on the rear side of the front panel 11. Holes (refer to FIG. 2) are formed in the upper portion of the ground panel 14 to receive the fastening members. An edge portion of the back cover 16 is stably disposed on the upper portion of the ground panel 14, and holes (one shown in FIG. 5) are formed in the edge portion of the back cover 16 to receive the fastening members. The fastening members are inserted into the coupling bosses 122c through the back cover 16, the ground panel 14, and the frame 13.

Meanwhile, the ground panel 14 includes a panel body 143 formed of a conductive metal, a blocking member 142 attached to a rear lower side of the panel body 143, and a ground gasket 141 attached to a front lower side of the panel body 143.

In detail, the blocking member 142 prevents foreign substances from permeating between the display module 15 and the front panel 11. The blocking member 142 can be formed of a material capable of blocking and collecting foreign substances, such as sponge and Velcro tape.

The ground gasket 141 is attached to the front lower side of the panel body 143 for blocking electromagnetic interference generated from the display module 15. For this, the ground gasket 141, the ground panel 14, and the back cover 16 can be formed of a conductive material. That is, undesired electromagnetic interference can be transmitted to a rear side of the display apparatus 10 through the ground panel 14 and the back cover 16.

As explained above, since the leakage preventing rib 123 is formed on the front edge portion of the support 12 close to the edge of the front panel 11, the adhesive 17 can be prevented from spreading to the outside of the display apparatus 10, and thus contamination of the display apparatus 10 can be prevented. In addition, the protrusions 124 are disposed on a front edge portion of the support 12 opposite to the leakage preventing rib 123. Therefore, the adhesive 17 applied between the support 12 and the front panel 11 can harden rapidly since the adhesive 17 can be exposed to air, and the thickness of the adhesive 17 can be uniform. Since the protrusions 124 are disposed inside the display apparatus 10 at distal edge portions, spreading of the adhesive 17 around the protrusions 124 can be allowed in some degree.

When assembled, a peripheral side of the frame 13 can be placed on the same plane as a peripheral side of the front panel 11. Alternatively, the peripheral side of the frame 13 can be placed inward from the peripheral side of the front panel 11. This structure can be applied to left, right, and upper sides of the display apparatus 10.

In other words, according to the above-described structure, the entire front side of the front panel 11 is exposed to the outside of the display apparatus 10, and the frame 13 does not protrude from the periphery of the front panel 11. Therefore, only the front panel 11 can be seen from the front of the display apparatus 10.

The display apparatus 10 of present disclosure does not require a frame structure or support structure for enclosing the edge portions of the front panel 11. Therefore, the display apparatus 10 can have a relatively large screen size and a neat and good appearance. That is, when the display apparatus 10 of the present disclosure is compared with the same size display apparatus of the related art that requires a cover or cabinet for enclosing the periphery of a front panel, the display apparatus 10 can have a more fancy appearance and a larger screen size.

In addition, the support 12 of the present disclosure is light since the support 12 is formed of a plastic material by injection molding. Furthermore, since the leakage preventing rib 123 formed on the front edge of the support 12 to prevent spreading of the adhesive 17, the width of the support 12 can be reduced. Thus, according to the present disclosure, a larger display module can be used in the display apparatus 10 without increasing the size of the front panel 11.

As described above, according to the present disclosure, the front appearance of the display apparatus 10 can be neat, and the screen of the display apparatus 10 can be seemed to be large.

Furthermore, the front panel 11 disposed in front of the display module 15 can be stably supported by the supports 12, and thus bending or deflection of the front panel 11 can be prevented even when the front panel 11 has a large size.

In addition, since the display apparatus 10 does not require an additional cover member for enclosing a front peripheral portion of the display apparatus, the display apparatus 10 can be manufactured through a simple process at low costs.

Moreover, since the supports 12 are designed to prevent spreading or leakage of the adhesive 17 applied between the front panel 11 and the supports 12, the peripheral portion of the display apparatus 10 can be neat.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus comprising:
   a transparent front panel including an exposed peripheral portion, the transparent front panel being formed of glass and the transparent front panel forming an entire front surface of the display apparatus;
   a display module to output an image at a rear side of the front panel;
   at least one support attached to the rear side of the front panel for supporting weight of the display module;
   a frame disposed along a rear edge portion of the front panel; and
   a back cover to cover the display module from the rear side of the front panel, wherein the back cover includes a front edge portion that extends in a direction toward the front panel, the front edge portion of the back cover is covered by the frame, and the at least one support, the frame and the back cover are coupled together by a fastening member.

2. The display apparatus according to claim 1, wherein a plurality of supports are attached to the rear side of the front panel at predetermined intervals.

3. The display apparatus according to claim 1, further comprising an adhesive applied between the support and the front panel, wherein the support comprises a rib on an edge portion for preventing spreading or leakage of the adhesive.

4. The display apparatus according to claim 1, wherein the support comprises a support portion protruding from a rear side of the support portion for supporting the weight of the front panel and increasing strength of the support.

5. The display apparatus according to claim 1, further comprising a ground panel between the front panel and the display module, the ground panel disposed along the rear side of the front panel for blocking electromagnetic interference generated from the display module.

6. The display apparatus according to claim 5, wherein the ground panel includes:
   a panel body formed of a conductive material;
   a ground gasket between the rear side of the front panel and a front side of the panel body; and
   a blocking member coupled to a rear side of the panel body.

7. The display apparatus according to claim 1, wherein an opaque shield film is provided on a rear edge of the front panel.

8. A display apparatus comprising:
- a front panel including entirely exposed side edge portions, the front panel having an entire front surface formed of a transparent material;
- a display module spaced a predetermined distance apart from a rear side of the front panel and configured to output an image;
- a plurality of supports attached to the rear side of the front panel and configured to support weight of the front panel;
- a frame attached to the supports from the rear side of the front panel; and
- a back cover attached to the frame and the back cover to enclose the display module for protecting the display module, wherein the back cover includes a front edge portion that extends in a direction toward the front panel, the front edge portion of the back cover is covered by the frame, and a fastening member couples the frame, the back cover and one of the supports,
- wherein at least a left side, a right side, and an upper side of the frame are respectively placed on the same planes as a left side, a right side, and an upper side of the front panel, or are respectively placed on the planes that are placed apart from the left side, the right side, and the upper side of the front panel towards a center of a front panel.

9. The display apparatus according to claim 8, wherein each of the plurality of supports comprises:
- a body in close contact with the rear side of the front panel; and
- a support portion that protrudes from a rear side of the body for supporting the weight of the front panel.

10. The display apparatus according to claim 9, wherein the body of the support comprises:
- a rib that extends on a front edge of the body for preventing leakage of an adhesive; and
- a plurality of protrusions disposed on another front edge of the body opposite to the rib, the protrusions having approximately a same height as the rib.

11. The display apparatus according to claim 9, wherein the support portion comprises:
- a reinforcement part protruding from the body and configured to increase strength of the body;
- a coupling boss extending backward from the reinforcement part and coupled to at least the frame and the back cover.

12. The display apparatus according to claim 8, further comprising a blocking member configured to fill a gap between the front panel and the display module.

13. The display apparatus according to claim 12, wherein the blocking member comprises a sponge.

14. The display apparatus according to claim 8, further comprising a ground gasket provided between the front panel and the display module, the ground gasket being attached to the rear side of the front panel for blocking electromagnetic interference.

15. The display apparatus according to claim 14, further comprising a ground panel that includes:
- a panel body formed of a conductive material;
- the ground gasket between the rear side of the front panel and a front side of the panel body; and
- a blocking member coupled to a rear side of the panel body.

16. The display apparatus according to claim 8, wherein an opaque shield film is provided on a rear edge of the front panel.

17. A display apparatus comprising:
- a front panel having a transparent front surface that defines an entire front surface of the display apparatus, the front panel further having exposed side edge portions, the front panel including an opaque shield film on a rear of the transparent front surface, the opaque shield film having a predetermined width and being disposed along an edge portion of the front panel;
- at least one support attached to a rear side of the front panel at which the shield film is disposed, the support being attached to the rear side of the front panel by an adhesive;
- a frame attached to a rear side of the support;
- a display module supported by the support, the display module to output an image;
- a back cover attached to the support from the rear side of the front panel, wherein the back cover includes a front edge portion that extends in a direction toward the front panel, the front edge portion of the back cover is covered by the frame, and the at least one support, the frame and the back cover are coupled by a fastening member; and
- a ground panel disposed between the front panel and the display module, the ground panel including a first end tightly disposed on the back cover and a second end disposed on the rear side of the front panel,
- wherein the support includes a leakage preventing rib on a front edge close to an outer edge of the front panel for preventing leakage of the adhesive.

18. The display apparatus according to claim 17, wherein the support further includes a plurality of protrusions on a front side for allowing the adhesive to be uniformly applied between the support and the front panel.

19. The display apparatus according to claim 18, wherein the protrusions are disposed at an edge of the support opposite to the leakage preventing rib.

20. The display apparatus according to claim 18, wherein the protrusions have approximately a same height as the leakage preventing rib so as to prevent the support from being obliquely attached to the rear side of the front panel.

21. The display apparatus according to claim 18, wherein the protrusions are arranged in a length direction of the support at predetermined intervals to expose the adhesive to air for a rapid hardening of the adhesive.

22. The display apparatus according to claim 17, wherein the frame includes peripheral sides provided on the same planes as an upper side, a left side, and a right side of the front panel, respectively.

23. The display apparatus according to claim 22, wherein the frame is disposed between the support and an end of the ground panel, and the fastening member is inserted into the support through the back cover, the end of the ground panel, and the frame.

24. The display apparatus according to claim 17, wherein the ground panel comprises:
- a panel body formed of a conductive material; and
- a ground gasket between the front panel and a front side of the panel body.

25. The display apparatus according to claim 24, wherein the ground panel further comprises a blocking member attached to a rear side of the panel body for filling a gap between the front panel and the display module.

* * * * *